US009800338B2

(12) United States Patent
Aguirre et al.

(10) Patent No.: US 9,800,338 B2
(45) Date of Patent: Oct. 24, 2017

(54) CONFIGURABLE DIPLEX FILTER WITH TUNABLE INDUCTORS

(71) Applicant: ARRIS Enterprises, Inc., Suwanee, GA (US)

(72) Inventors: Sergio Alfredo Mendoza Aguirre, Nuevo Leon (MX); LuisJavier Aguirre, Nuevo Leon (MX)

(73) Assignee: ARRIS Enterprises LLC, Suwanee, GA (US)

( * ) Notice: Subject to any disclaimer, the term of this patent is extended or adjusted under 35 U.S.C. 154(b) by 187 days.

(21) Appl. No.: 14/340,952

(22) Filed: Jul. 25, 2014

(65) Prior Publication Data

US 2016/0028484 A1    Jan. 28, 2016

(51) Int. Cl.

| *H03H 7/46* | (2006.01) |
|---|---|
| *H04B 10/2575* | (2013.01) |
| *H01F 17/00* | (2006.01) |
| *H01F 41/04* | (2006.01) |
| *H01F 27/28* | (2006.01) |
| *H01F 27/29* | (2006.01) |
| *H04N 21/238* | (2011.01) |
| *H04N 21/239* | (2011.01) |
| *H04N 21/61* | (2011.01) |
| *H05K 1/02* | (2006.01) |

(Continued)

(52) U.S. Cl.
CPC ... *H04B 10/25751* (2013.01); *H01F 17/0006* (2013.01); *H01F 27/2804* (2013.01); *H01F 27/292* (2013.01); *H01F 41/045* (2013.01); *H03H 7/463* (2013.01); *H04N 21/238* (2013.01); *H04N 21/239* (2013.01); *H04N 21/615* (2013.01); *H04N 21/6118* (2013.01);
*H05K 1/029* (2013.01); *H05K 1/0292* (2013.01); *H05K 1/165* (2013.01); *H01F 2017/0073* (2013.01); *H05K 3/22* (2013.01); *H05K 2201/10363* (2013.01); *H05K 2203/171* (2013.01)

(58) Field of Classification Search
CPC ............ H04B 10/25751; H04B 1/0057; H01F 17/0006; H01F 27/2804; H01F 27/292; H01F 41/045; H01F 2017/0073; H03H 7/465; H04N 21/238; H04N 21/239; H04N 21/6118; H04N 21/615; H05K 1/0253
USPC ........................................................ 333/132
See application file for complete search history.

(56) References Cited

U.S. PATENT DOCUMENTS

| 4,926,292 A | 5/1990 | Maple |
|---|---|---|
| 5,239,289 A | 8/1993 | Ferraiolo et al. |

(Continued)

FOREIGN PATENT DOCUMENTS

| FR | 2141551 A1 | 1/1973 |
|---|---|---|
| JP | S61256611 A | 11/1986 |
| JP | H0992537 A | 4/1997 |

OTHER PUBLICATIONS

PCT Invitation to Pay Additional Fees, Re: Application No. PCT/US2015/037711, (Form ISA/206), dated Oct. 23, 2015.

(Continued)

*Primary Examiner* — Robert Pascal
*Assistant Examiner* — Kimberly Glenn
(74) *Attorney, Agent, or Firm* — Lori Anne D. Swanson

(57) ABSTRACT

A diplex filter having tunable inductors. Preferably the tunable inductors include pads that may each selectively receive one end of a jumper.

25 Claims, 11 Drawing Sheets

(51) Int. Cl.
H05K 1/16 (2006.01)
H05K 3/22 (2006.01)

(56) References Cited

U.S. PATENT DOCUMENTS

| | | | | |
|---|---|---|---|---|
| 5,461,353 | A * | 10/1995 | Eberhardt | H01F 17/0013 333/246 |
| 7,126,443 | B2 | 10/2006 | De Bhailis et al. | |
| 2003/0186674 | A1 | 10/2003 | Keeney et al. | |
| 2014/0327496 | A1* | 11/2014 | Zuo | H03H 7/463 333/132 |
| 2015/0109067 | A1* | 4/2015 | Park | H01G 4/40 333/17.1 |

OTHER PUBLICATIONS

"Chebyshev Filter", as defined by Wikipedia.com, http://en.wikipedia.org/wiki/Chebyshev_filter, as downloaded on Jun. 30, 2014.

PCT Search Report & Written Opinion, Re: Application No. PCT/US2015/037711, dated Jan. 15, 2016.

\* cited by examiner

CONFIGURABLE DIPLEX FILTER WITH TUNABLE INDUCTORS

CROSS-REFERENCE TO RELATED APPLICATIONS

None

BACKGROUND

The present disclosure relates to systems and methods that process signals over a cable transmission network.

Although Cable Television (CATV) networks originally delivered content to subscribers over large distances using an exclusively RF transmission system, modern CATV transmission systems have replaced much of the RF transmission path with a more effective optical network, creating a hybrid transmission system where cable content originates and terminates as RF signals over coaxial cables, but is converted to optical signals for transmission over the bulk of the intervening distance between the content provider and the subscriber. Specifically, CATV networks include a head end at the content provider for receiving RF signals representing many channels of content. The head end receives the respective RF content signals, multiplexes them using an RF combining network, converts the combined RF signal to an optical signal (typically by using the RF signal to modulate a laser) and outputs the optical signal to a fiber-optic network that communicates the signal to one or more nodes, each proximate a group of subscribers. The node then reverses the conversion process by de-multiplexing the received optical signal and converting it back to an RF signal so that it can be received by viewers.

Cable television (CATV) networks have continuously evolved since first being deployed as relatively simple systems that delivered video channels one-way from a content provider. Early systems included transmitters that assigned a number of CATV channels to separate frequency bands, each of approximately 6 MHz. Subsequent advancements permitted limited return communication from the subscribers back to the content provider either through a dedicated, small low-frequency signal propagated onto the coaxial network. Modern CATV networks, however, provide for not only a much greater number of channels of content, but also provide data services (such as Internet access) that require much greater bandwidth to be assigned for both forward and return paths. In the specification, the drawings, and the claims, the terms "forward path" and "downstream" may be interchangeably used to refer to a path from a head end to a node, a node to an end-user, or a head end to an end user. Conversely, the terms "return path", "reverse path" and "upstream" may be interchangeably used to refer to a path from an end user to a node, a node to a head end, or an end user to a head end.

Simultaneous transmission of respective signals along each of a forward path and a return path requires that electronic components in the transmission network be configured to isolate the frequencies dedicated to the forward and return path, respectively. As bandwidth requirements for these paths increase over time, significant costs are incurred in upgrading components to be configured to the new splits between frequency bands devoted to the forward path and the return path. It would be desirable to reduce such costs.

DETAILED DESCRIPTION

Figure 1:
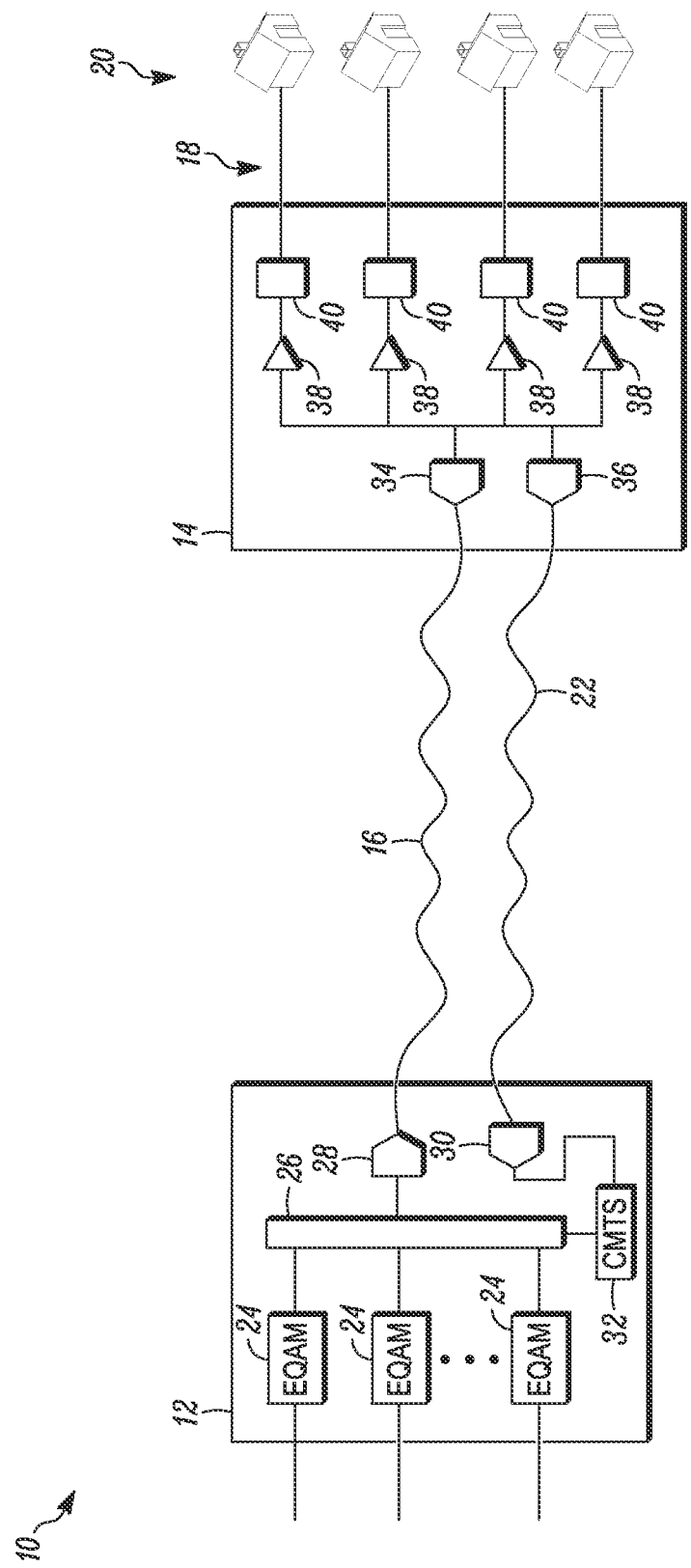
FIG. 1 shows an exemplary HFC network from a head end to a node that serves a plurality of home subscribers.

Referring to FIG. 1, a CATV Hybrid Fiber-Coaxial (HFC) network 10 may include a head end 12 that delivers content over a forward path to a node 14 over an optical transmission line 16. The node 14 may in turn deliver content to a plurality of subscribers 20 over a coaxial network 18. The HFC network 10 may likewise transmit signals over a return path from each of the subscribers 20 to the node 14 through the coaxial network 18, which in turn transmits the return path signal to the head end 12 through an optical transmission line 22.

The head end 12 may preferably modulate a plurality of cable channels using one or more EdgeQAM units 24. The respective channels may be combined by an RF combining network 26 that multiplexes the signals and uses the multiplexed signal to modulate an optical transmitter (e.g., a laser) that delivers the optical signal to transmission line 16. The head end 12 may also include an optical receiver 30 that receives return path signals from the optical transmission line 22 and delivers the return path signals to a Cable Modem Termination System (CMTS) 32, which instructs each of the cable modems when to transmit return path signals, such as Internet protocol (IP) based signals, and which frequency bands to use for return path transmissions. The CMTS 32 demodulates the return path signals, translates them into (IP) packets, and redirects them to a central switch (not shown) that transmits the IP packets to an IP router for transmission across the Internet. It should be understood by those skilled in the art that this configuration may be modified in any number of manners. For example, one or more of the EQAM units may be analog modulated or digitally modulated, or may be directly modulated in a Converged Cable Access Platform (CCAP). Similarly, the head end may include an A/D converter between the RF combining network 26 and the optical transmitter 28 so as to modulate the optical signal to the node using a digital rather than an analog signal.

The node 14 preferably includes an optical receiver 34 to receive a forward path signal from the head end 12 over the optical transmission line 16, along with an optical transmitter 36 to send the return path signals to the head end 12 over the optical transmission line 22. The optical receiver 34 is preferably capable of demultiplexing a received optical signal and using the demultiplexed signals to modulate respective RF signals sent to subscribers 20 through a network of amplifier units 38 and diplexers 40.

As noted previously, the respective RF signals communicated between the node 14 and the subscribers 20 include both forward path and reverse path transmissions, both typically carried over a common coaxial cable. To carry forward and return path signals over the same coaxial cable, different bands of the RF spectrum are assigned to each of the forward path (high band) and the return path (low band), and typically separated by a guard band to prevent signal interference between the respective signals. The frequency at which the forward path and return path are separated is usually referred to as a "split" and typically is defined as the midpoint of the guardband.

As can be appreciated from FIG. 1, the node 14 must be capable of separately processing the forward and return path signals that are propagated on the same coaxial cable. In FIG. 1 for example, CATV amplifiers such as the amplifier units 38 amplify the forward path signal and the return path signal simultaneously. Thus, the amplifier units 38 may typically be operatively connected to a minimum of two diplex filters—a first diplex filter that separates the return path from the forward path, after which these RF signals are separately amplified, and then a second diplex filter (e.g. diplexers 40) that recombines the separated signals onto a common coaxial cable sent to a subscriber 20 or to a head end.

Figure 2:
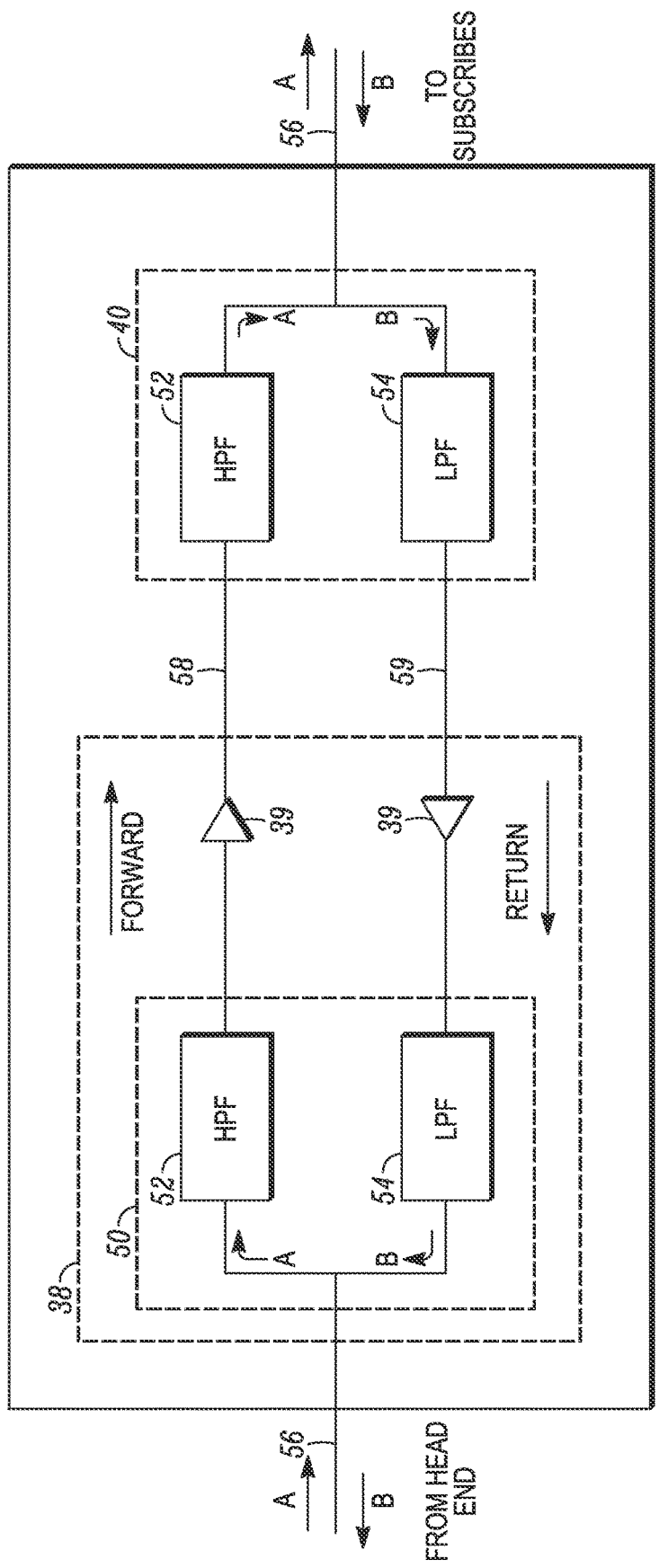
FIG. 2 schematically shows a CATV amplifier with a diplex filter installed.

FIG. 2 schematically shows an exemplary circuit utilizing an amplifier unit 38 having a diplex filter 50 that includes a high pass filter 52 and a low pass filter 54. A common coaxial cable 56 carrying both an upper band signal (denoted as "A" in the figure) and a lower band signal (denoted as "B") is connected to both the high pass filter 52 and the low pass filter 54. As shown in the drawings, the high band signal "A" and the low band signal "B" are propagating in different directions though the diplex filter 50 and the coaxial cable 56, consistent with the relative directions of the forward and return path signals through the HFC network 10 of FIG. 1. The high pass filter 52 is configured to pass to transmission line 58 that part of the forward input 56 propagated within the common cable 56 that exceeds a threshold frequency, which is preferably set within the guardband of the CATV transmission system. Similarly, the low pass filter 54 is configured to pass from transmission line 59 that part of the return input propagated within the common cable 56 that does not exceed a threshold frequency, which is again preferably set within the guardband of the CATV transmission system. The frequency cutoff of the low pass filter 54 typically has a guard band with respect to the high pass filter 52 to improve crossover isolation. The greater the width of the guard band, the greater the improvement in crossover isolation, but at the expense of using additional portions of the frequency spectrum. The transmission lines 58 and 59 are preferably also coaxial cables, but as noted above, each of these respective coaxial cables will carry only one of the forward path signal and the return path signal.

The transmission lines 58 and 59 are preferably also connected to a high pass filter 52 and a low pass filter 54, respectively, in the diplexer 40. The diplexer 40 recombines the upper and lower band signals so that they may be propagated within the coaxial cable 56 that extends between the node 14 and the subscribers 20.

Figure 3:
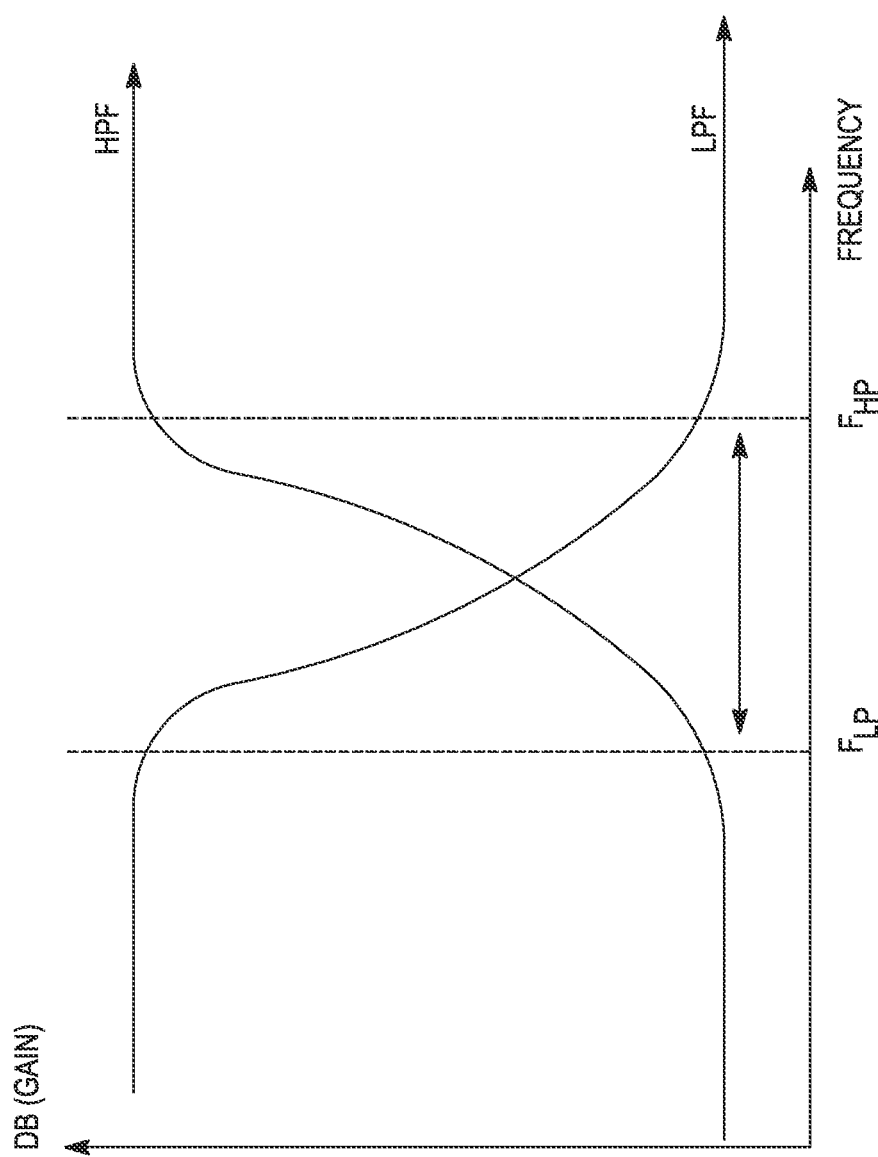
FIG. 3 shows an ideal frequency response of the diplex filter of FIG. 2.

FIG. 3 shows an ideal frequency plot of the diplex filter shown in FIG. 2. As can be seen in this figure, the forward path signal is preferably filtered by the high pass filter 52 to attenuate frequencies below the cutoff $f_{HP}$. Similarly, the return path signal is preferably filtered by the low pass filter 54 to attenuate frequencies above the cutoff $f_{LP}$. The frequency band between $f_{HP}$ and $f_{LP}$ preferably corresponds to the guard band between the frequency band assigned to the forward path signal and the frequency band assigned to the return path signal.

As the required bandwidth for the forward path and/or the return path changes over time as CATV broadcast systems evolve, the frequency ranges for the forward and return path will vary. For example, the DOCSIS (Data Over Cable Service Interface Specifications) 1.x standard was initially released in March 1997 and called for a downstream throughput of approximately 43 Mbps and an upstream throughput of approximately 10 Mbps along a minimum of one channel. DOCSIS 2.0, released in late 2001 required an improved upstream throughput of approximately 31 Mbps, again for a minimum of one channel. DOCSIS 3.0, released in 2006 required that the DOCSIS 2.0 throughput standards of 43 Mbps and 31 Mbps, respectively, be provided along a minimum of four channels in each direction. Looking forward, the DOCSIS 3.1 platform is aiming to support capacities of at least 10 Gbps downstream and 1 Gbps upstream using 4096 QAM. The new specification aims to replace the 6 MHz and 8 MHz wide channel spacing with smaller 20 kHz to 50 kHz orthogonal frequency division multiplexing (OFDM) subcarriers, which can be bonded inside a block spectrum that could end up being about 200 MHz wide.

As the frequency bands assigned to the respective forward and return paths change, so does the split between these frequencies. Thus, the evolution to increasing bandwidth for both forward and return path transmission requires extensive upgrades of signal processing components, such as the diplex filters previously described because that equipment was designed and constructed to process forward and return path signals with a particular split frequency between them. Moreover, because legacy components designed for one transmission standard are upgraded gradually over time, during transitions between transmission standards there exists a need for components tuned to both standards.

To manufacture diplex filters, as well as other signal processing components, inductors are often used to provide the desired frequency response of the component, including the frequency split of the diplex filter. Preferably, the diplex filter shown in FIG. 2 uses tunable inductors, as doing so achieves two related advantages. First, in many cases during manufacturing, a circuit must be assembled first and thereafter tested. If upon testing the circuit is not within operational or desired limits, replacement is both time consuming and expensive, and a tunable inductor would obviate replacement in some instances. Moreover, tunable inductors allow signal processing components such as diplex filters to be printed on circuit boards that can then be later tuned to provide the desired frequency response, such as a desired frequency split, thereby allowing economies of scale in printing electronics that may be used across a wider range of applications.

Inductors are created on or within a printed circuit by laying traces such that current runs in opposite directions in two segments of the trace closely spaced with respect to each other. The opposing currents thereby create mutual inductance due to the electromagnetic fields between the trace segments. Typical inductors may be spiral-shaped or U-shaped for example. One technique of creating a tunable inductor is to print an inductor with multiple shorts between the opposed segments—for example shorts between adjacent loops in a spiral, or shorts between the legs of a U-shaped inductor. Such inductors may be tuned using a laser or electron beam to cut selective ones of the shorts. Tuning of an inductor is not only beneficial in adjusting the inductance of the inductor, but it's Q (quality factor) as well.

An ideal inductor would have no resistance or energy losses. However, real inductors have winding resistance from the metal wire forming the coils. Since the winding resistance appears as a resistance in series with the inductor, it is often called the series resistance. The inductor's series resistance converts electric current through the coils into heat, thus causing a loss of inductive quality. The Q of an inductor is the ratio of its inductive reactance to its resistance at a given frequency, and is a measure of its efficiency. The higher an inductor's Q, the closer it approaches the behavior of an ideal, lossless, inductor and the narrower the bandwidth of its resonant response.

Q is generally measured as $$Q = \frac{\omega L}{R}$$

where L is the inductance, R is the inductor's effective series resistance, ω is the radian operating frequency, and the product ωL is the inductive reactance. Q increases linearly with frequency if L and R are constant. Although they are constant at low frequencies, the parameters vary with frequency. Qualitatively at low frequencies and within limits, increasing the number of turns N for a constant radius improves Q because L varies as $N^2$ while R varies linearly with N. Similarly, increasing the radius r of an inductor by increasing the number of turns for a constant width between adjacent segments improves Q because L varies as $r^2$ while R varies linearly with r.

A spiral inductor manufactured to be tunable using shorts that may be trimmed is space efficient; for a given tunable range the inductor takes very little space. The drawback to this type of tunable spiral inductor is that the breaching of shorts across the spiral segment produces somewhat unpredictable results and has relatively coarse granularity in its tuning To add a sufficient number of shorts to provide fine granularity adds manufacturing expense. A U-shaped inductor manufactured with trimmable shorts, conversely, is useful where fine tuning is required but space is not a premium consideration. Its inductance can be varied by breaching a short across its vertical legs and the variance is substantially predictable, correlating highly to the number and spacing of the rungs.

Figure 5:
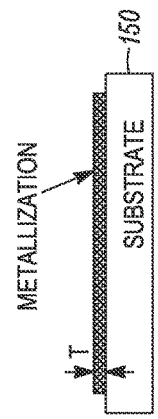
FIGS. 4 and 5 show a top view and an edge view of a spiral inductor having a plurality of pads for selectively mounting one or more SMD jumpers to tune the spiral inductor.
Figure 4:
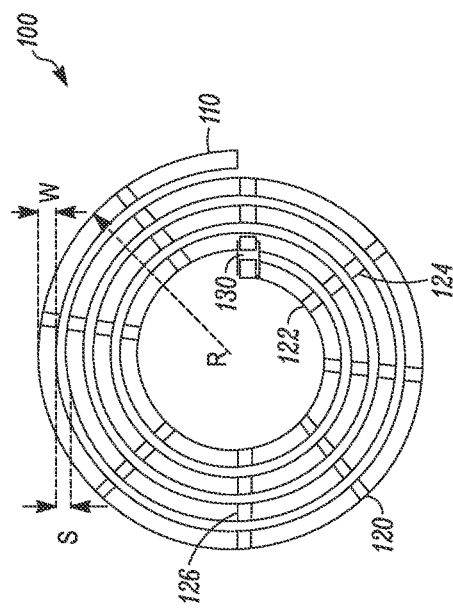

FIGS. 4 and 5 show an alternate type of tunable inductor useful in manufacturing signal processing components such as diplex filters. Though FIGS. 4 and 5 illustrate a tunable planar spiral coil, it should be understood that the tunable coil may be any other appropriate shape, such as U-shaped. It should also be understood that the spiral can be any geometrical shape, such as a spiral, square, rectangle, or even a combination of such geometrical shapes. FIG. 4 shows a top view of a spiral inductor 100 having a spiral trace 110, for which a signal will typically begin at the center of the coil and spiral outward. The trace 110 is shown as having a width "w" and a separation distance "s" designed to generate inductance between the parallel segments of the traces. The traces have a thickness "T" and are etched on a substrate 150 (shown in FIG. 5).

Rather than including shorts between adjacent segments of the spiral inductor, which may be later trimmed, the spiral inductor 100 includes a plurality of SMD (Surface Mounted Device) pads, each capable of receiving one end of an SMD jumper 130. The jumper 130 preferably comprises a zero-ohm resistor that effectively creates a short, thereby modifying the inductance of the spiral by shortening the trace length. Stated differently, rather than creating a plurality of shorts between adjacent trace segments, and then tuning the inductor by using a laser to cut all of the shorts except the ones that are to be used, the spiral inductor 100 includes pads by which a short may simply be inserted, where desired. The benefit of using the pads/jumpers of the spiral inductor 100 is that the tuning process is no longer destructive, as the inductor (and the circuit of which it is a part) may be tested and readjusted by simply moving the jumper(s) to a new location or locations. Once testing for a given application is completed, the same jumper position or positions may be used in production runs, and in some embodiments the SMD pads may be used to simply solder traces in the desired locations indicated during testing.

In some embodiments, the jumper 130 may comprise a capacitor or an inductor, rather than a zero-ohm resistor. Alternatively, the jumper 130 may comprise a resistor with a resistance greater than zero ohms. Furthermore, the inductor 100 may be used with a plurality of jumpers 130 that include jumpers of different lengths to allow the selective shorting of a two pads 120 that are not adjacent. Thus, with jumpers of differing lengths, the pad 122 may be connected to the pad 124, the pad 126, or any other pad 120 of the inductor 100.

Figure 6:
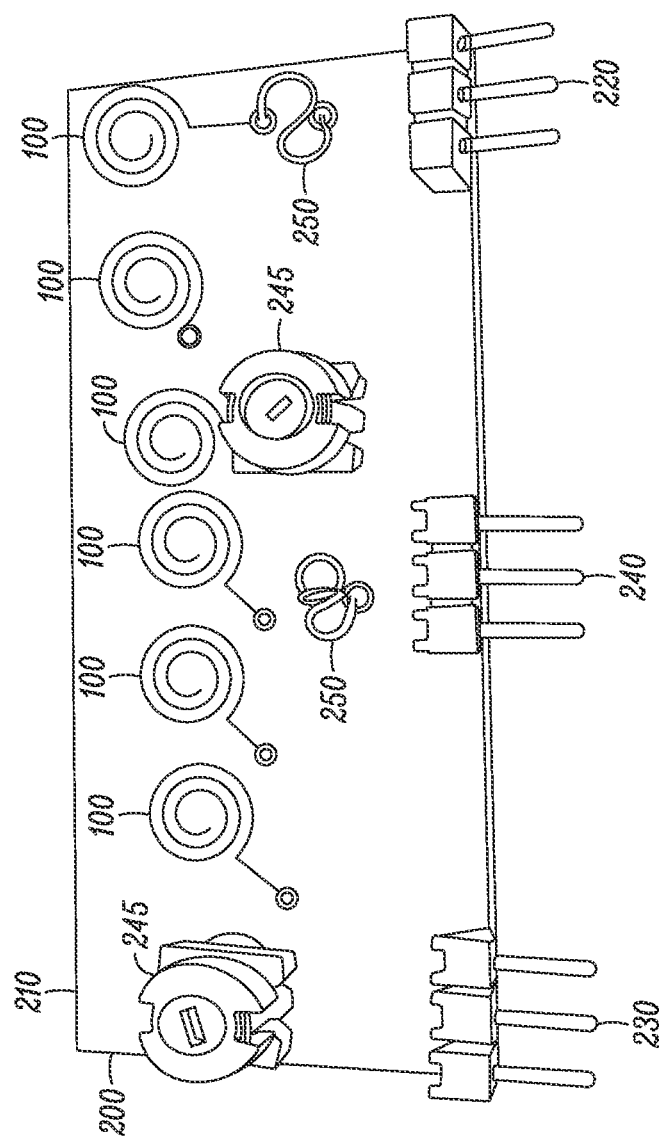
FIG. 6 shows a PWB diplex filter having a plurality of planar spiral inductors as shown in FIGS. 4 and 5.

FIG. 6 shows an exemplary diplex filter 200 printed on a substrate 210 that includes a plurality of inductors 100 printed on the surface of the substrate 210. The diplex filter 200 includes an input 220 for receiving an upper band signal, an output 230 for a lower band signal, and a common input 240 for a common carrier of both the upper and lower bands. In other words, the diplex filter 200 implements the filter 50 schematically shown in FIGS. 2 and 3. The diplex filter 200 also includes one or more tunable screw-type toroid coils 245 used to modify the inductance of the diplex filter 200 and respective air coils 250 respectively connected to the inputs 220 and 240 to improve the matching coupling of the filter. Air coils 250, though tunable by opening the windings apart, are used due to their better Quality Factor (Q) and improves the impedance matching (return loss), meaning that most of the RF signal is transmitted onwards while conversely, little of the RF signal is reflected back towards the source. The tunable screw-type coils 245 have an intermediate Q between the printed coils 100 and the air coils 250, and can absorb part of the signal noise or variance caused by capacitor tolerances and variations in the PWB fabrication process.

Figure 7:
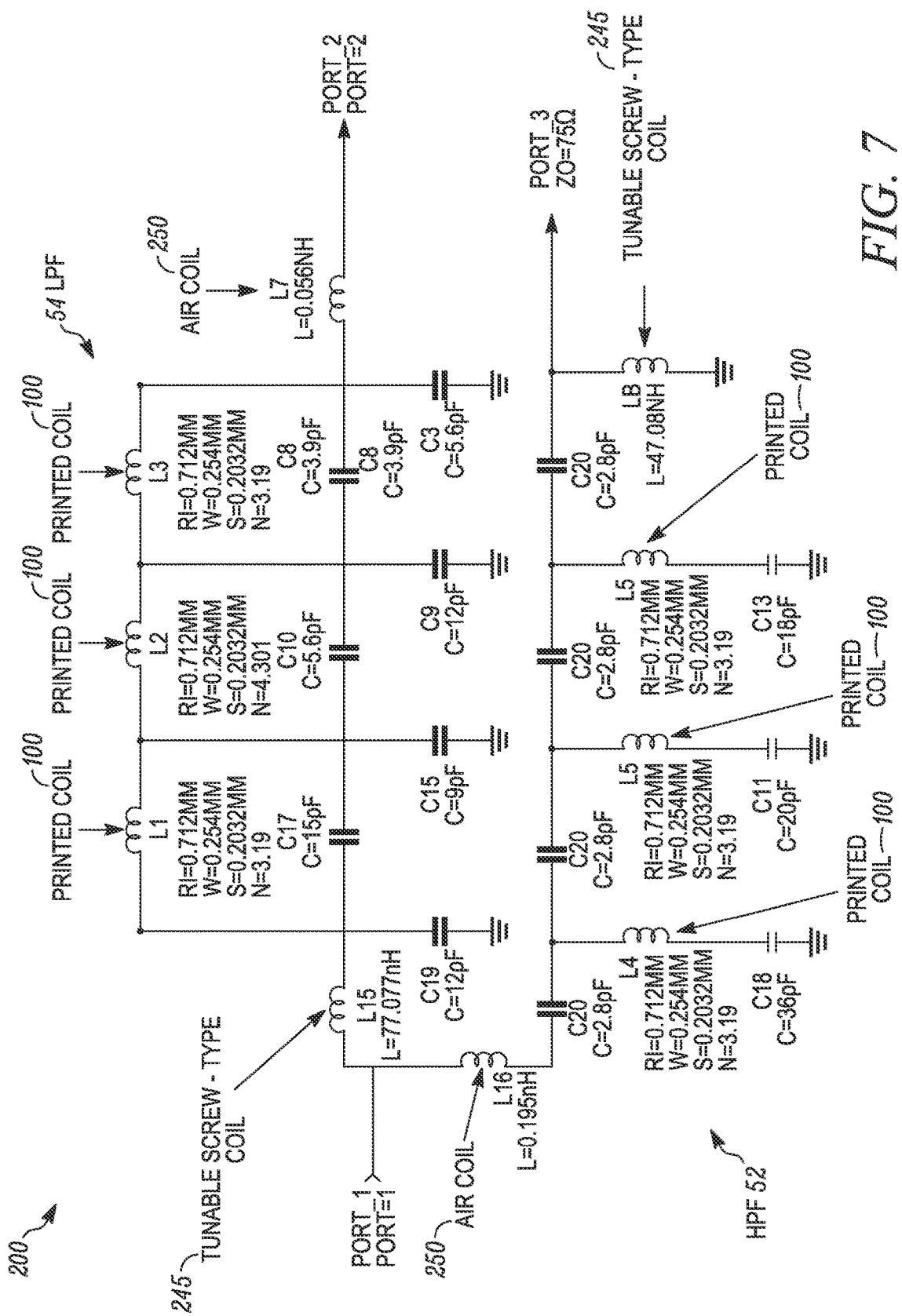
FIG. 7 shows a circuit diagram of the PWB diplex filter of FIG. 6.

FIG. 7 shows a circuit diagram of the diplex filter 200 having the high pass filter 52 and the low pass filter 54. As can be seen in this figure, each of the filters 52 and 54 include three printed coils 100, one tunable screw-type coil 245, and one air coil 250. Those of ordinary skill in the art will recognize that more coils may be used than the number shown, and that different combinations of printed coils, air coils, and screw-type coils may be employed, with one type of coil substituting for another type of coil as needed.

The diplex filter 200 is preferably configured to have the gain of each of the high pass and low pass filters based on $$G_n(\omega, \omega_0) = \frac{1}{\sqrt{1 + \frac{1}{\varepsilon^2 T_n^2(\omega_0/\omega)}}}.$$

where $T_n$ is a Chebychev polynomial of order "n," $\omega_0$ is the cutoff frequency, and ε is a ripple factor. The ripple factor may be given by $$\varepsilon = \frac{1}{\sqrt{10^{0.1\gamma} - 1}}.$$

where $\gamma$ is the stopband attenuation given in decibels. In the stopband, the Chebyshev polynomial will oscillate between −1 and 1 so that the gain will oscillate between zero and $$\frac{1}{\sqrt{1 + \frac{1}{\varepsilon^2}}}$$

where the smallest frequency at which this maximum is attained will be the cutoff frequency $\omega_0$. The diplex filter thus described desirably has a relatively steep response in the respective cutoff regions of both the high pass filter and the low pass filter to improve rejection in the crossover region (i.e. the guardband) between the high pass filter and the low pass filter. By improving the rejection in the crossover region a smaller guardband may be used, which conserves frequency spectrum as indicated earlier.

Figure 8:
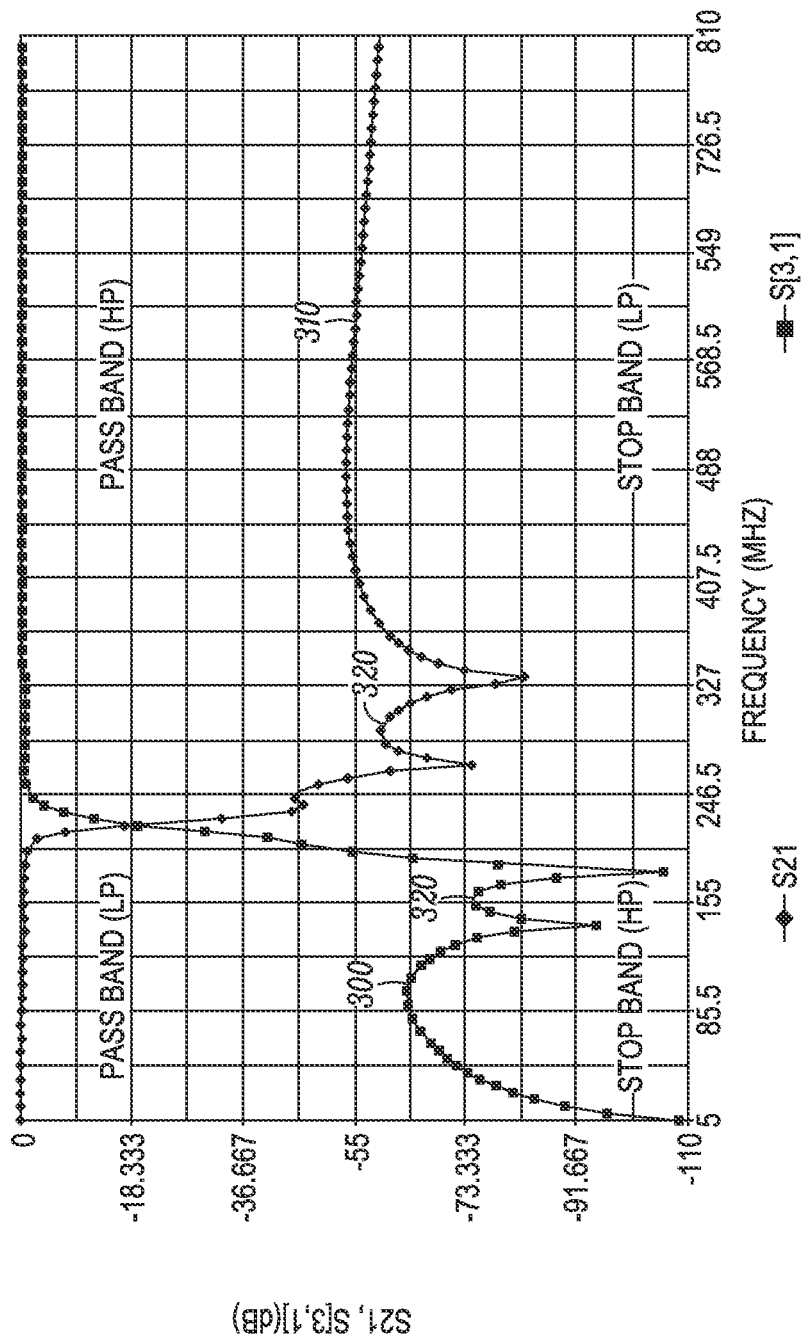
FIGS. 8 and 9 show simulations of frequency responses for a diplexer tuned to an H-split using the tunable inductors shown in FIG. 6.
Figure 9:
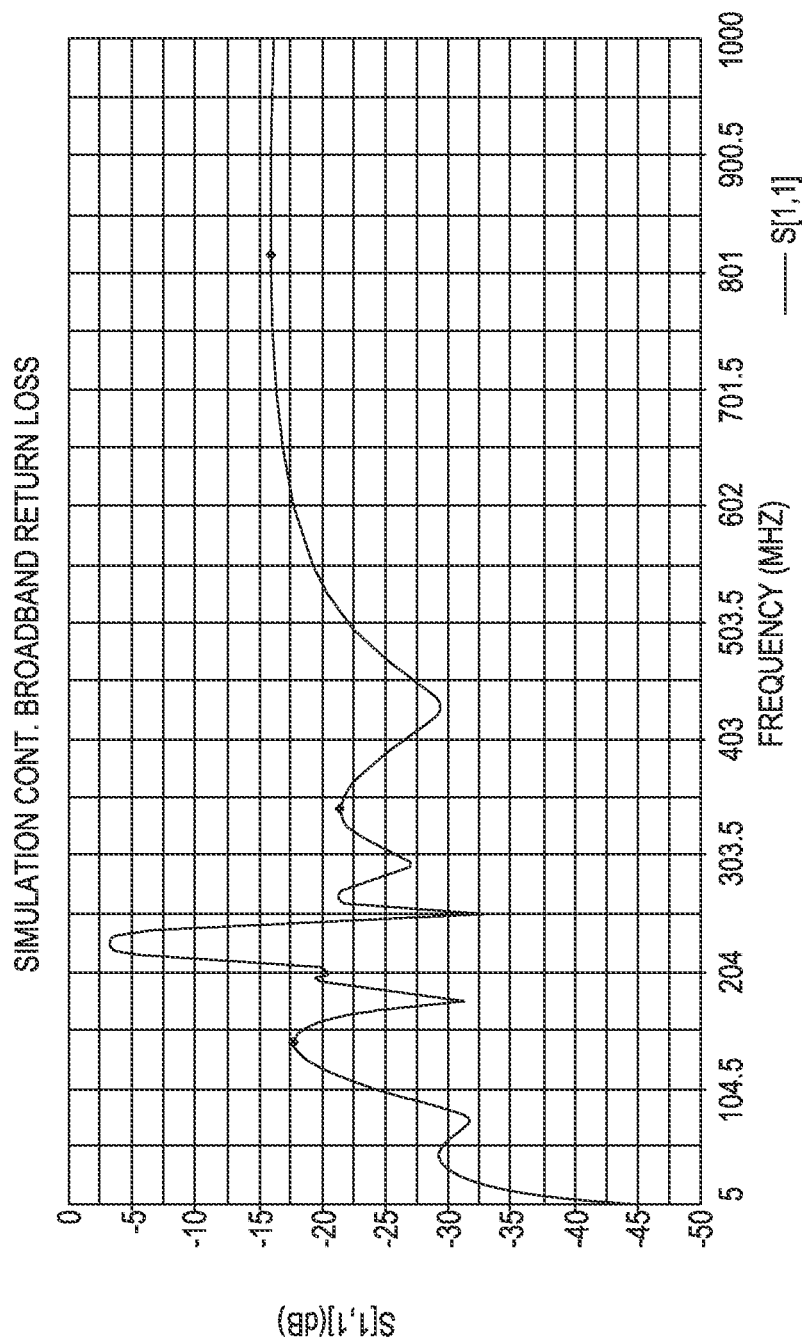

FIGS. 8 and 9 illustrate the simulated response of the filter 200 that shows the characteristics indicated in the preceding paragraph. For example, in both the high pass signal 300 and the low pass signal 310, the stopband exhibits an attenuated ripple effect 320 that causes the gain to oscillate in the stopband. However, the filter does not have ripple in the passband. These characteristics are beneficial for the diplex filter 200 because the passband signals are typically amplified, and amplification of spurious variations in the signal imparted by filter design is generally undesirable. Moreover, any amplification of ripple in the stopband can be negated by further applying an appropriate high pass or low pass filter to the respective outputs of the diplex filter 200. These figures illustrate a diplex filter configured to an H split where the forward path signal is carried over frequencies of 258 MHZ and above while the return path signals are carried over frequencies less than 200 MHz. FIG. 9 shows that the simulated worst case return loss in the forward path is approximately 16 decibels, and is approximately 18 decibels in the return path.

Figure 10:
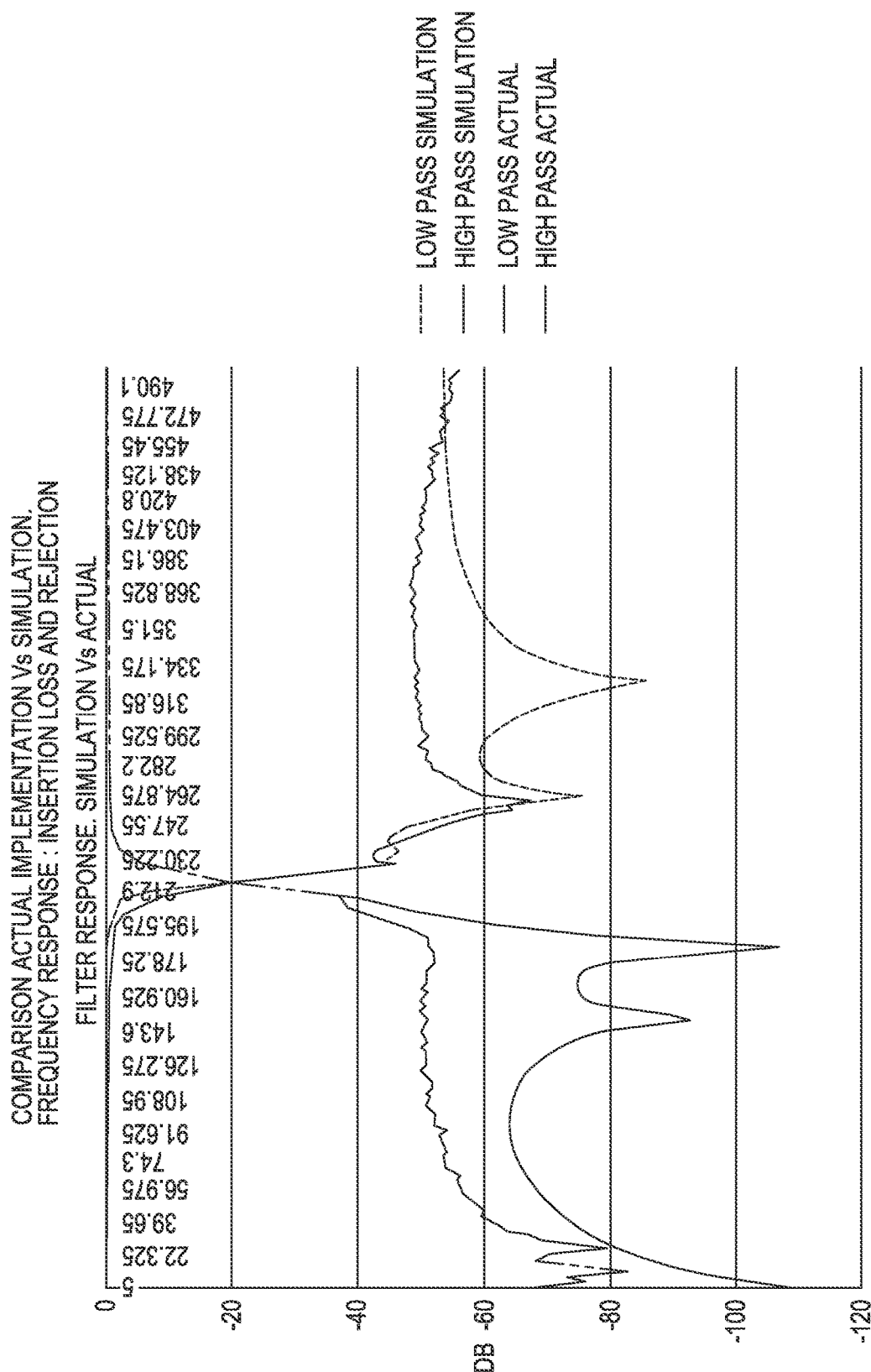
FIGS. 10-12 shows comparisons of simulated and actual responses for a diplexer tuned to an H-split using the tunable inductors shown in FIGS. 6 and 7.
Figure 11:
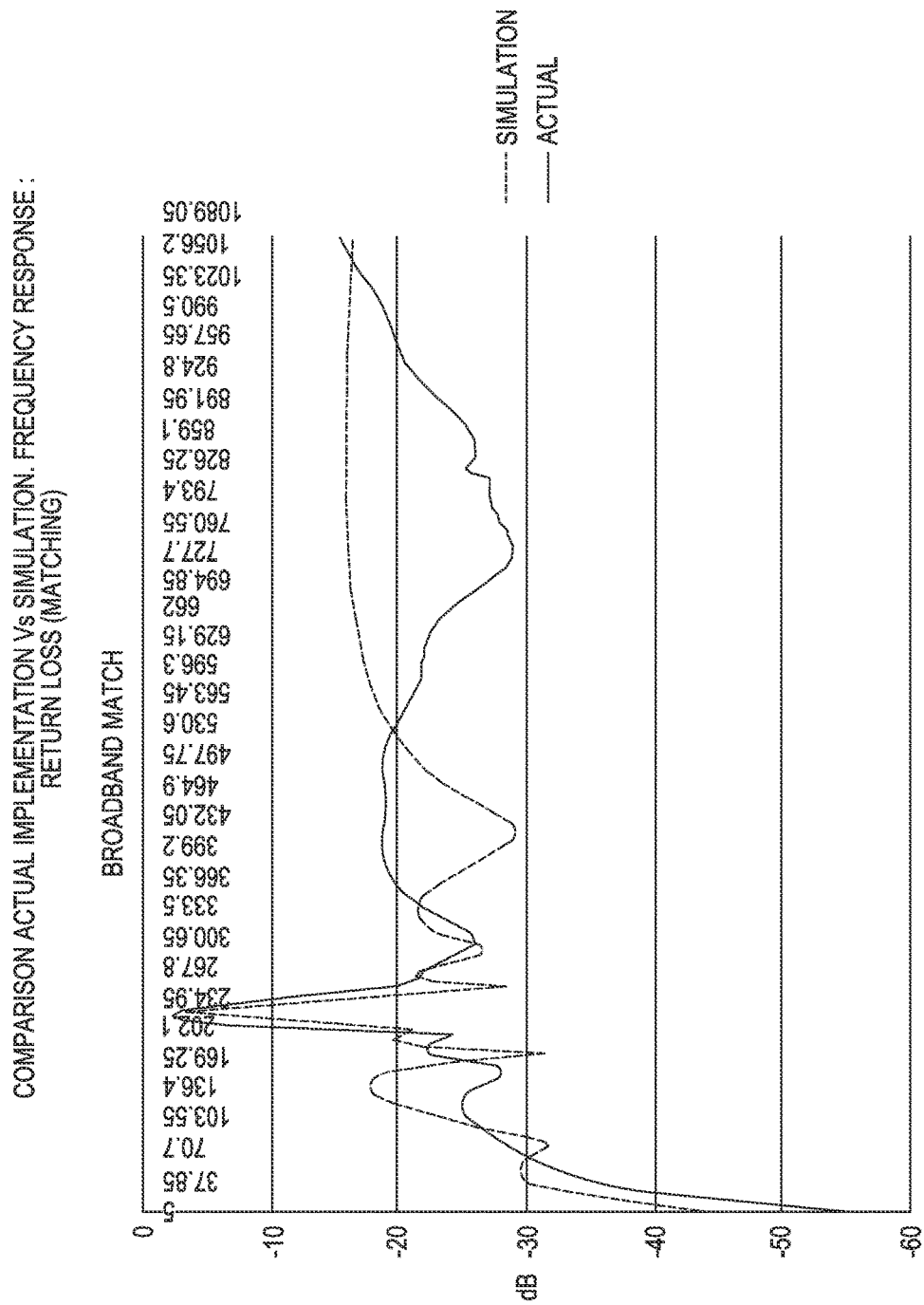
Figure 12:
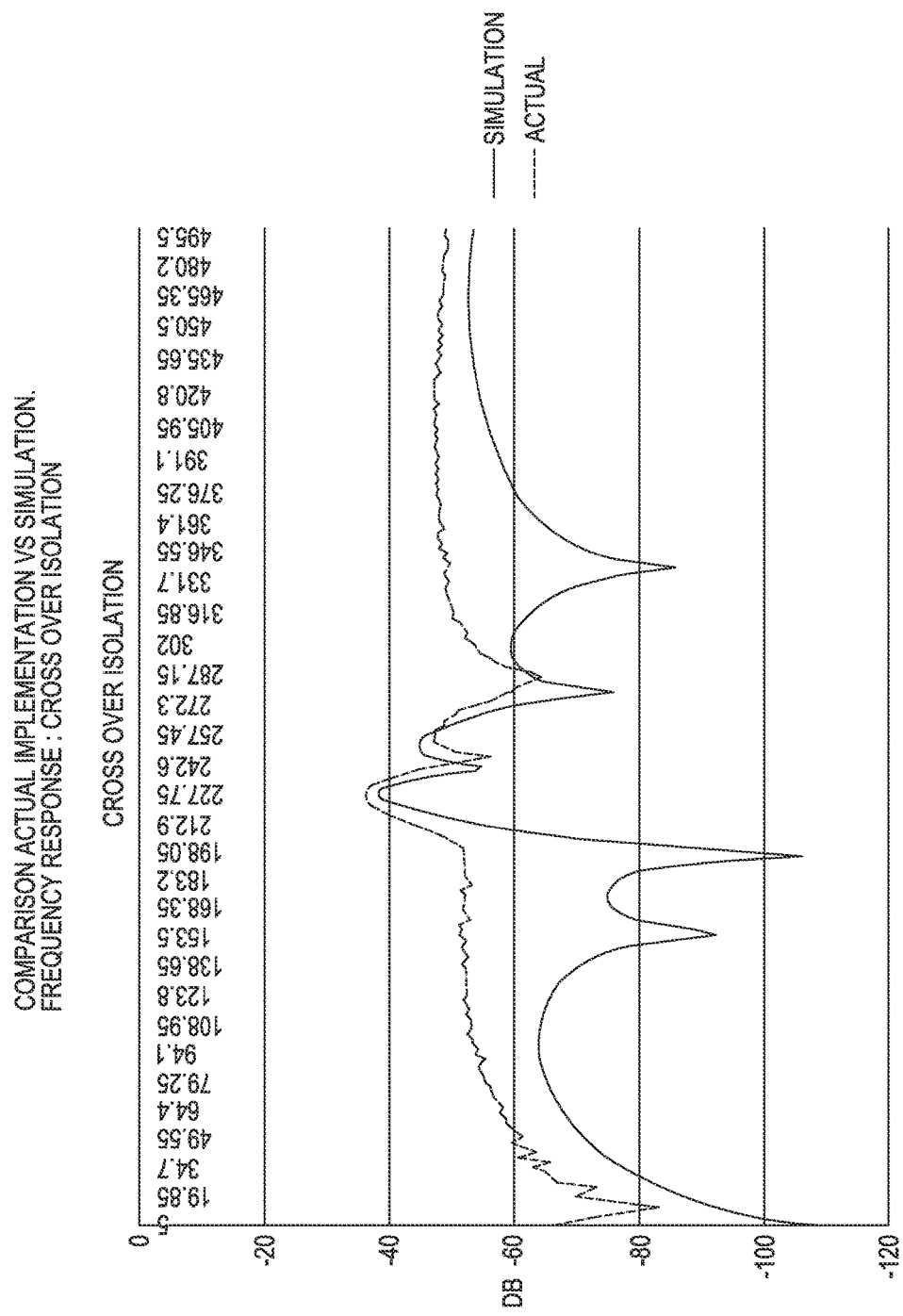

FIGS. 10-12 compare the actual response of a diplex filter configured for an H-split to the simulated response. Each of these figures show that the actual response corresponds well to the simulated response.

The terms and expressions that have been employed in the foregoing specification are used therein as terms of description and not of limitation, and there is no intention, in the use of such terms and expressions, of excluding equivalents of the features shown and described or portions thereof, it being recognized that the scope of the claimed subject matter is defined and limited only by the claims that follow.

The invention claimed is:

1. A printed circuit board including a diplex filter and forming at least one inductor traced on a surface of said board, said inductor having a plurality of pads, each of said pads selectable for receiving one end of a jumper, the printed circuit board comprising:
    a first pad for receiving a first end of said jumper;
    a second pad for receiving a second end of said jumper,
    where the first end of said jumper received by the first pad and the second end of said jumper received by the second pad causes a modification to an inductance of said inductor.

2. The printed circuit board of claim 1 where said inductor is spiral shaped.

3. A printed circuit board of forming at least one U-shaped inductor traced on a surface of said board, said inductor having a plurality of pads, each of said pads selectable for receiving one end of a jumper, the printed circuit board comprising:
    a first pad for receiving a first end of said jumper;
    a second pad for receiving a second end of said jumper,
    where the first end of said jumper received by the first pad and the second end of said jumper received by the second pad causes a modification to an inductance of said inductor.

4. The printed circuit board of claim 3 where said circuit board includes a diplex filter.

5. The printed circuit board of claims 1 or 4 where the diplex filter has a split frequency that is modified by a position of said jumper on said inductor.

6. The printed circuit board of claims 1 or 4 where said jumper causes a short in said inductor between said first pad and said second pad.

7. A printed circuit board forming at least one inductor traced on a surface of said board, said inductor having a plurality of pads, each of said pads selectable for receiving one end of a jumper, the printed circuit board comprising:
    a first pad for receiving a first end of said jumper;
    a second pad for receiving a second end of said jumper,
    where the first end of said jumper received by the first pad and the second end of said jumper received by the second pad causes a modification to an inductance of said inductor,
    where a position of said jumper can be moved from a first location to a second location, where in the first location the ends of said jumper are selectively received by said first pad and said second pad, respectively, and wherein said second location at least one end of the jumper is selectively received by a third pad, different from said first pad and said second pad.

8. The printed circuit board of claims 1 or 7 where a Q of said inductor is modified when said jumper has the first end received by the first pad and the second end received by the second pad different from said first pad.

9. A diplex filter comprising:
    (a) a first external connection for propagating a first signal, a second external connection for propagating a second signal, and a third external connection for propagating said first signal and said second signal;
    (b) a high pass filter for attenuating said second signal and a low pass filter for attenuating said first signal, wherein at least one of said high pass or low filters are operable to reduce ripple in a respective frequency band of at least one said second signal or said first signal;
    (c) an inductor having an inductance based on a position of a selectively removable jumper,
    wherein the first signal and the second signal are propagated in respective frequency bands that do not overlap, and where the frequency split between said respective frequency bands is determined at least in part by the position of said jumper.

10. The diplex filter of claim 9 where the frequency split of said diplex filter can be changed when the position of said jumper changes.

11. The diplex filter of claim 9 where said inductor has at least three pads capable of selectively receiving a respective end of said jumper and where at least one of said at least three pads does not receive a respective end of said jumper.

12. A method for tuning a diplex filter on a printed circuit board and having at least one inductor formed by a trace on said printed circuit board, said inductor having a plurality of pads, each of said pads capable of selectively receiving an end of a jumper, said method comprising:
   (a) placing a first end of said jumper on a selected first one of said plurality of pads;
   (b) placing a second end of said jumper on a selected second one of said plurality of pads; and
   (c) removing the jumper from the first one and the second one of said plurality of pads, and subsequently placing the first end of said jumper at a selected third one of said plurality of pads and placing the second end of said jumper at a fourth one of said plurality of pads.

13. The method of claim 12 where a Q of said inductor is modified when said jumper has the first end received by the first selected pad and the second end received by the second pad different from said first pad.

14. The method of claim 12 where the frequency split of said diplex filter is determined by which of said plurality of pads are selected to receive respective ends of said jumper.

15. The method of claim 12 including the steps of placing a third end of a second jumper on a selected third one of said plurality of pads and placing a fourth end of said second jumper on a selected fourth one of said plurality of pads.

16. The method of claim 12 where said jumper is a zero-ohm resistor.

17. The method of claim 12 including the step of removing said jumper from respective third and fourth ones of said plurality of pads prior to placing said first end of said jumper on said selected first one of said plurality of pads.

18. The method of claim 12, wherein a Q of said inductor is modified when said pair of pads receive a resistive or reactive component such as and not limited to a resistor, capacitor, inductor or nonlinear device.

19. A method for tuning a diplex filter on a printed circuit board and having at least one inductor formed by a trace on said printed circuit board, said inductor having a plurality of pads, each of said pads capable of selectively receiving an end of a jumper, said method comprising:
   (a) placing a first end of said jumper on a selected first one of said plurality of pads; and
   (b) placing a second end of said jumper on a selected second one of said plurality of pads,
   wherein a Q of said inductor is modified when said jumper has the first end received by the first selected pad and the second end received by the second pad different from said first pad.

20. The method of claim 19, wherein the Q of said inductor is modified when said pair of pads receive a resistive or reactive component such as and not limited to a resistor, capacitor, inductor or nonlinear device.

21. The method of claim 19 where the frequency split of said diplex filter is determined by which of said plurality of pads are selected to receive respective ends of said jumper.

22. The method of claim 19 including placing a third end of a second jumper on a selected third one of said plurality of pads and placing a fourth end of said second jumper on a selected fourth one of said plurality of pads.

23. The method of claim 19 where said jumper is a zero-ohm resistor.

24. The method of claim 19 including removing said jumper from respective third and fourth ones of said plurality of pads prior to placing said first end of said jumper on said selected first one of said plurality of pads.

25. A method for tuning a diplex filter on a printed circuit board and having at least one inductor formed by a trace on said printed circuit board, said inductor having a plurality of pads, each of said pads capable of selectively receiving an end of a jumper, said method comprising:
   (a) placing a first end of said jumper on a selected first one of said plurality of pads;
   (b) placing a second end of said jumper on a selected second one of said plurality of pads; and
   (c) removing said jumper from respective third and fourth ones of said plurality of pads prior to placing said first end of said jumper on said selected first one of said plurality of pads.

* * * * *